United States Patent
Helder

(10) Patent No.: US 6,625,559 B1
(45) Date of Patent: Sep. 23, 2003

(54) SYSTEM AND METHOD FOR MAINTAINING LOCK OF A PHASE LOCKED LOOP FEEDBACK DURING CLOCK HALT

(75) Inventor: Edward R. Helder, Fremont, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/562,043

(22) Filed: May 1, 2000

(51) Int. Cl.[7] .................................................. H04L 7/00
(52) U.S. Cl. ...................................... 702/117; 375/371
(58) Field of Search ................................. 702/117, 118, 702/106, 122; 375/371, 373, 375, 376; 714/731, 798; 327/156, 232

(56) References Cited

U.S. PATENT DOCUMENTS

| | | |
|---|---|---|
| 4,876,446 A | 10/1989 | Kambe et al. |
| 5,349,587 A * | 9/1994 | Nadeau-Dostie et al. ... 714/729 |
| 5,517,147 A | 5/1996 | Burroughs et al. ......... 327/295 |
| 5,864,564 A | 1/1999 | Levitt et al. ................. 371/223 |
| 5,900,757 A | 5/1999 | Kggarwal et al. .......... 327/198 |
| 6,330,681 B1 * | 12/2001 | Cote et al. ................... 713/322 |

* cited by examiner

Primary Examiner—Marc S. Hoff
Assistant Examiner—Edward Raymond

(57) ABSTRACT

A system and method for maintaining lock of a phase locked loop within an integrated circuit during both a normal operation mode and a test mode, and during switching from the normal operation mode to the test mode, is disclosed. The method includes closing a phase locked loop feedback path of the phase locked loop with a real clock signal from a real clock tree during the normal operation mode. The real clock tree is selectively halted, thereby transitioning from the normal operation mode to the test mode. The phase locked loop feedback path of the phase locked loop is closed with a copy of a clock signal from a copy clock tree such that the phase locked loop maintains lock. The steps of halting the real clock and closing the phase locked loop feedback path with a copy clock signal are completed during a single clock cycle such that lock is maintained during switching from the normal operation to the test mode.

28 Claims, 4 Drawing Sheets

SYSTEM AND METHOD FOR MAINTAINING LOCK OF A PHASE LOCKED LOOP FEEDBACK DURING CLOCK HALT

THE FIELD OF THE INVENTION

The present invention relates generally to a clocking system and method associated with a phase locked loop, and more specifically, to a clocking scheme for maintaining lock of a phase locked loop within an integrated circuit during a normal operation mode and a test mode in which the clock signal is halted, and during the switching from the normal operation mode to the test mode.

BACKGROUND OF THE INVENTION

The sophistication of a present-day electronic system is a result of complex functions handled by digital integrated circuits making up the electronic system. Digital integrated circuits comprise the majority of electronic circuits in computers and other digital electronic products. Digital integrated circuits can be configured, for example, as a central processing unit (CPU), a programmable logic array (PLA), an application specific integrated circuit (ASIC), or a digital signal processor (DSP). Both the sophistication and speed of operation of these digital integrated circuits have rapidly increased due to improvements in integrated circuit manufacturing and design technologies resulting in smaller and faster devices.

The performance of a computer or electronic device is increased if the delivery time of the central clocking signal is equal to all integrated circuits and components thereof. Unequal delivery times to different components of the system is defined as skew. Therefore, skew basically is a measure of the quality or lack of quality of delivery time of a central clock to different components of the system. To increase the quality of the system, it is desirous to minimize the skew of the system. One factor contributing to the skew of a system is the location of various integrated circuits within the system. The physical distances from the clock to various destination points of the system will differ. As is known in the art, differing physical lengths of conductors equates into differing delay times to the various integrated circuits. In addition to the above-described skew associated with the delivery of the clock signal to integrated circuits within the system, there is also a skew associated with a clock delivery scheme within each integrated circuit.

As is known in the art, the skew associated with delivering the clock to various integrated circuits located at different distances from the central clock is easily minimized by providing conductors of equal lengths between the central clock and the various integrated circuits through use of additional wiring or delay elements provided in the conductors. However, this strategy of using the same conductor lengths or delay components within a particular integrated circuit is not feasible due to a significant difference in operating speed of one integrated circuit as compared to another integrated circuit. In some cases, the operating speed of two integrated circuits may vary by as much as 50 percent.

One solution to addressing the varying operation speed of integrated circuits within a system is to incorporate a phase locked loop at the input of a clock signal to an integrated circuit. A phased locked loop provides a self-correcting element to the clock signal within a particular integrated circuit so that there is minimal clock variation from integrated circuit to integrated circuit within an overall system.

In the form of an example, if a clock takes 3 nanoseconds to be distributed throughout the first integrated circuit once received at the input of the first integrated circuit and the clock takes 1.50 nanoseconds to be distributed throughout a second integrated circuit once received at the input of the second integrated circuit, then there is a 2:1 ratio in the propagation speed of the distributed clock signals. Therefore, there is a 1.50 nanosecond skew between the first and second integrate circuits. A phase locked loop attempts to compensate for this skew. However, depending upon the quality of electronic components used in the phase locked loop and the design of the phased locked loop, there remains a skew associated with the system since it is virtually impossible to design and implement an ideal phase locked loop.

In order to maximize the compensation of a phase locked loop, it is important to properly select a feedback point from which the phase locked loop feedback path will be generated. Thus, a feedback point for the phase locked loop feedback path should be chosen corresponding to a final clock location within an integrated circuit. However, in current designs, a clock signal, once to the integrated circuit, is propagated to up 40,000 final clock locations. Therefore, it is impractical to determine the best location for the feedback point. Rather, one of the 40,000 final clock locations is randomly chosen as the feedback point.

A critical aspect of an electronic system is that the various components of the system must be tested to ensure proper operation and interconnection. In order to perform a test procedure (test mode), the central clock of the system is halted or stopped. Known test data is then scanned into the various electronic components of the system. The clock is then restarted at the maximum operating frequency of the system for a minimal number of clock cycles. The system clock is again halted and data is scanned out of the various electronic components. The operation of the system can be analyzed by comparing the scanned out data to expected results. This process, called "stop-and-scan" or "stop-and-step", ensures that data is moving within the system from location to location meeting correct timing requirements.

A significant issue associated with testing the electronic device is that the clock of the device is halted or stopped. Since the feedback point of the phase locked loop feedback path is coupled to the clock, the feedback path is broken and the phase locked loop does not maintain lock during a clock halt. As is known in the art, if a phase locked loop does not maintain lock, the function of the phase locked loop is lost. One known solution which addresses the issue of a halted clock resulting in a loss of lock for a phase locked loop is to generate a copy or "dummy" clock. A real clock tree can be masked off near the root of the tree to cause a clock halt, but the copy clock tree is an unmasked major branch off of the root of the clock tree. Since the copy clock tree is not masked off or halted, the clock of the real clock tree can be halted while the feedback point of the phase locked loop is generated from the copy clock, thereby maintaining its feedback path and its lock. Further, masking the real clock facilitates test procedures in that the real clock can be restarted, n-stepped, and re-halt while in the test mode.

The disadvantage of utilizing a copy of the real tree branch for maintaining lock of the phase locked loop is that it is extremely difficult to match and track the real clock tree in latency over a process and operating conditions. To the degree that this mismatch and mis-track of the copy clock is inaccurate, there is a direct increase in integrated circuit clock skew between the internal clock of the integrated circuit and an external clock. This clock skew is a severe disadvantage in normal, non-test mode. In some cases, the clock slew associated with a phase locked loop utilizing a feedback point from a copy clock may be greater than having no phase locked loop compensation. Therefore, there is a need for a clocking system and method which can maintain lock of a phase locked loop feedback path in either a normal operation mode or a test mode, while minimizing the overall skew of the system.

SUMMARY OF THE INVENTION

The present invention provides a system and method capable of maintaining lock of a phase locked loop feedback path in both a normal operation mode and a test mode, and during the switching of the system from the normal operation mode to the test mode, while minimizing the overall skew of the system.

One embodiment of the present invention provides a method of maintaining lock of a phase locked loop feedback path within an integrated circuit during both normal operation mode and test mode. The method includes closing a phase locked loop feedback path of the phase locked loop with a real clock signal from a real clock tree during the normal operation mode. The real clock tree is then halted, thereby transitioning the system from a normal mode to a test mode. The phase locked loop feedback path of the phase locked loop is closed with a copy clock signal from a copy clock tree during the test mode, such that the phase locked loop maintains lock. The steps of halting the real clock and switching the feedback point from the real clock to the copy clock are performed in a single clock cycle.

The method further includes scanning known data into electronic components of the integrated circuit during the test mode. A full speed clock is provided to the electronic component of the integrated circuit for at least one clock cycle. Data within the electronic components after the at least one clock cycle are scanned out of the electronic components of the integrated circuit. The scanned data is compared to expected data and the integrated circuit is reset after the comparison procedure.

The method further comprises providing an output signal of the phase locked loop to the real clock tree and to the copy clock tree during normal enabling mode. The step of halting within real clock tree then further includes disabling a clocking gate and the real clock tree such that an output signal of the phase locked loop does not pass through the clocking gate. Further, a phase locked loop feedback input signal is selectively controlled based upon a mode of the integrated circuit, such that the phase locked loop feedback input signal is derived from the real clock signal during normal operation mode and derived from the copy clock signal during the test mode.

The present invention also includes a system for maintaining lock of a phase lock loop within an integrated circuit during a normal mode and a test mode, and during the switching between the normal operation mode and the test mode. The system includes a phase locked loop having a clock input, a feedback input, and an output. The clock input of the phase locked loop is capable of receiving a clock signal. A clocking gate has an input electrically coupled to the output of the phase locked loop. A real clock tree is electrically coupled to an output of the clocking gate. The real clock tree provides a clock signal to electrical components of the integrated circuit. A copy clock tree is also electrically coupled to the output of the phase locked loop. A multiplexor has a first input electrically coupled to the real clock tree and a second input electrically coupled to the copy clock tree. The multiplexor has an output electrically coupled to the feedback input of the phase locked loop. A controller is electrically coupled to the clocking gate for selectively controlling the output of the clocking gate and electrically coupled to the multiplexor for selectively controlling the output of the multiplexor.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention provides a system and method for maintaining lock of a phase locked loop within an integrated circuit during both a normal operation mode and a test mode, and during the switching between the normal operation mode and the test mode. The present invention minimizes a skew associated with a clock signal within an integrated circuit. Two separate parallel phase locked loop feedback paths are included in the present invention such that a first feedback has a feedback point chosen from a real clock tree which is provided to a phase locked loop during a normal operation mode of the integrated circuit. A second phase locked loop feedback path includes a feedback point chosen from a copy clock signal which is provided to the phase locked loop during a test mode of the integrated circuit. The feedback path provided at an input to the phase locked loop is switched from the real clock signal feedback path to the copy clock signal feedback path in the same clock cycle that the real clock tree is halted to initial test procedures. Thus, the present invention provides a phase locked loop feedback path which minimizes the skew of the system, regardless of the mode of the system.

Figure 1:
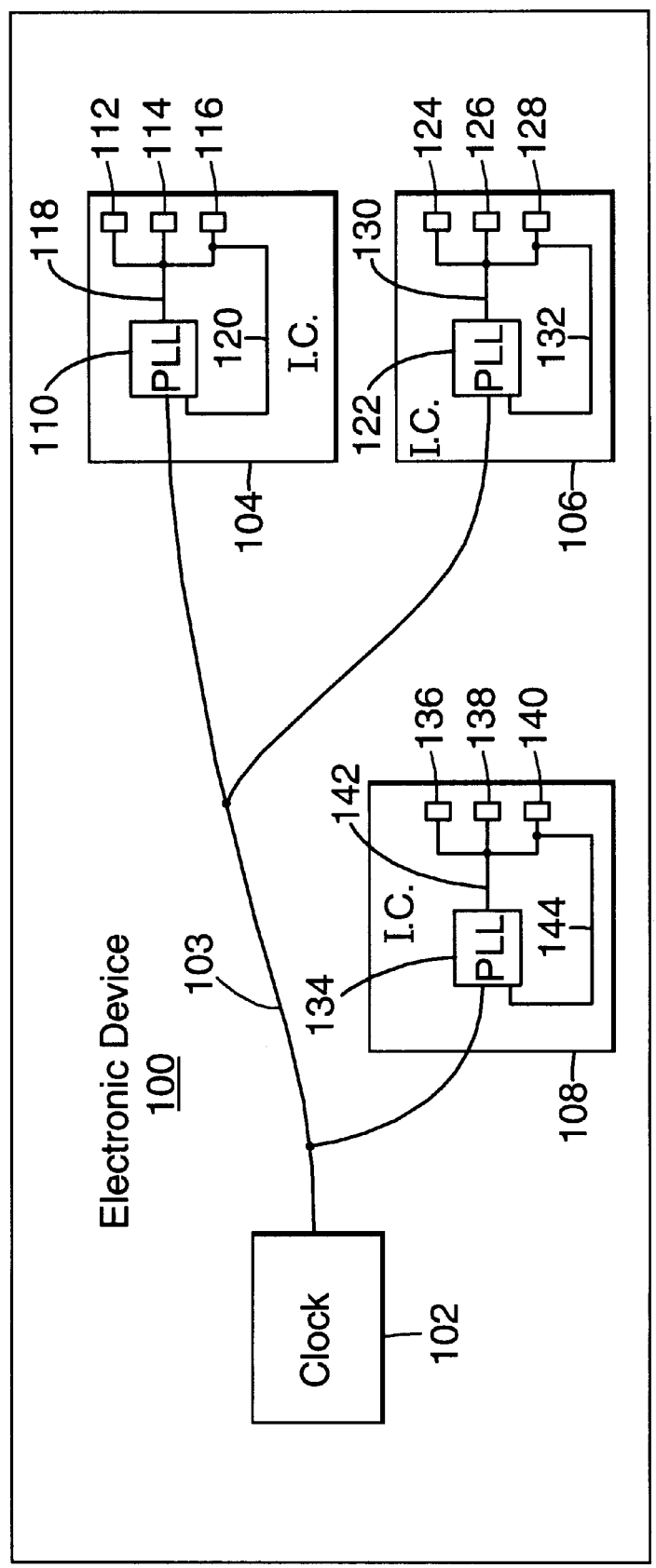
FIG. 1 is a block diagram illustrating a prior art clocking scheme of an electronic device.

FIG. 1 is a block diagram illustrating a prior art clocking scheme for electronic device 100. Electronic device 100 may represent a computer or other digital electronic products incorporating several integrated circuits. Electronic device 100 includes clock 102, clock signal 103, and integrated circuits 104, 106, and 108. It is understand that while FIG. 1 includes three integrated circuits, any number of integrated circuits may be included within electronic device 100 without deviating from the present invention.

Integrated circuit 104 includes phase locked loop 110, electrical components 112, 114, and 116, real clock signal 118, and phase locked loop feedback path 120. Integrated circuit 106 includes phase locked loop 122, electrical components 124, 126, and 128, real clock signal 130, and phase locked loop feedback path 132. Integrated circuit 108 includes phase locked loop 134, electronic components 136, 138, and 140, real clock signal 142, and phase locked loop feedback path 144. It is understood that while FIG. 1 includes three electrical components per integrated circuit, any number of electronic components including the assistance of a signal may be included within each integrated circuit without deviating from the present invention.

Phase locked loops 110, 122, and 134 are necessary within integrated circuits 104, 106, and 108 to minimize the skew associated with the delivery time of clock signal 103 to electronic components 112, 114, 116, 124, 126, 128, 136, 138, and 140.

There are two characteristics within a phase locked loop design which can increase or decrease the overall efficiency of the phase locked loop. First, the design and individual components of the phase locked loop can be chosen such that the skew associated with the integrated circuit is minimized. Present-day understanding of circuit design provides for optimal phase locked loop design. Second, the feedback point from which the feedback path of the phase locked loop is generated may be chosen. Ideally, the feedback path of a phase locked loop should be fed from the particular point at which the real clock is delivered. However, in present-day integrated circuits, there are over 40,000 locations to which the clock signal is supplied. Therefore, any final branch of the real clock tree is chosen to facilitate minimizing skew.

Electronic device 100, including integrated circuits 104, 106, and 108, preferably operates in one of two specific modes. First, electronic device 100 including integrated circuits 104, 106, and 108 preferably operates in a normal operation mode in which all electronic components of electronic device 100 are performing their intended functions. Second, electronic device 100 preferably operates in a test mode. In the test mode, clock 102 is halted or stopped. Known data is scanned in to various aspects of electronic device 100 such as electronic components 112, 114, 116, 124, 126, 128, 136, 138, and 140. Clock 102 is restarted at full speed, meaning operating at the maximum frequency of electronic device 100. The test takes a minimal amount of time. In some tests, only one or two clock cycles are needed. Other tests may require up to 500 clock cycles. Data is then scanned out of electrical components 112, 114, 116, 124, 126, 128, 136, 138, and 140 and compared to expected values. If the scanned out values equal the expected values, then electronic device 100 is properly operating. This testing procedure is called "stop-and-scan" or "stop-and-step". The stop-and-scan or stop-and-step technique is a powerful tool to ensure that electronic circuit 100 is capable of operating at a maximum frequency of electronic device 100. This technique also ensures that data is moving from location to location under a correct timing sequence.

Electronic device 100, shown in FIG. 1, is not capable of properly operating in a test mode as described above. Electronic device 100 includes feedback paths 120, 132, and 144 of phase locked loops 110, 122, and 134 generated from real clock signal 118, 130, and 142, respectively. Once clock 102 is halted, all real clock signal stop and phase locked loop feedback paths 120, 132, and 144 no longer provide lock to phase locked loops 110, 122, and 134. Therefore, phase locked loops 110, 122, and 134 enter an erratic and undefinable state. Phase locked loops 110, 122, are 134 will produce clocked signals wandering throughout a wide spectrum of frequencies, since the associated feedback paths 120, 132, and 144 will not provide any proper feedback to maintain lock.

Therefore, while the design shown in FIG. 1 minimizes a skew associated with electronic device 100 in normal operation mode, it cannot maintain lock of phase locked loops 110, 122, and 134 during test mode, thereby producing extremely undesirous effects.

Figure 2:
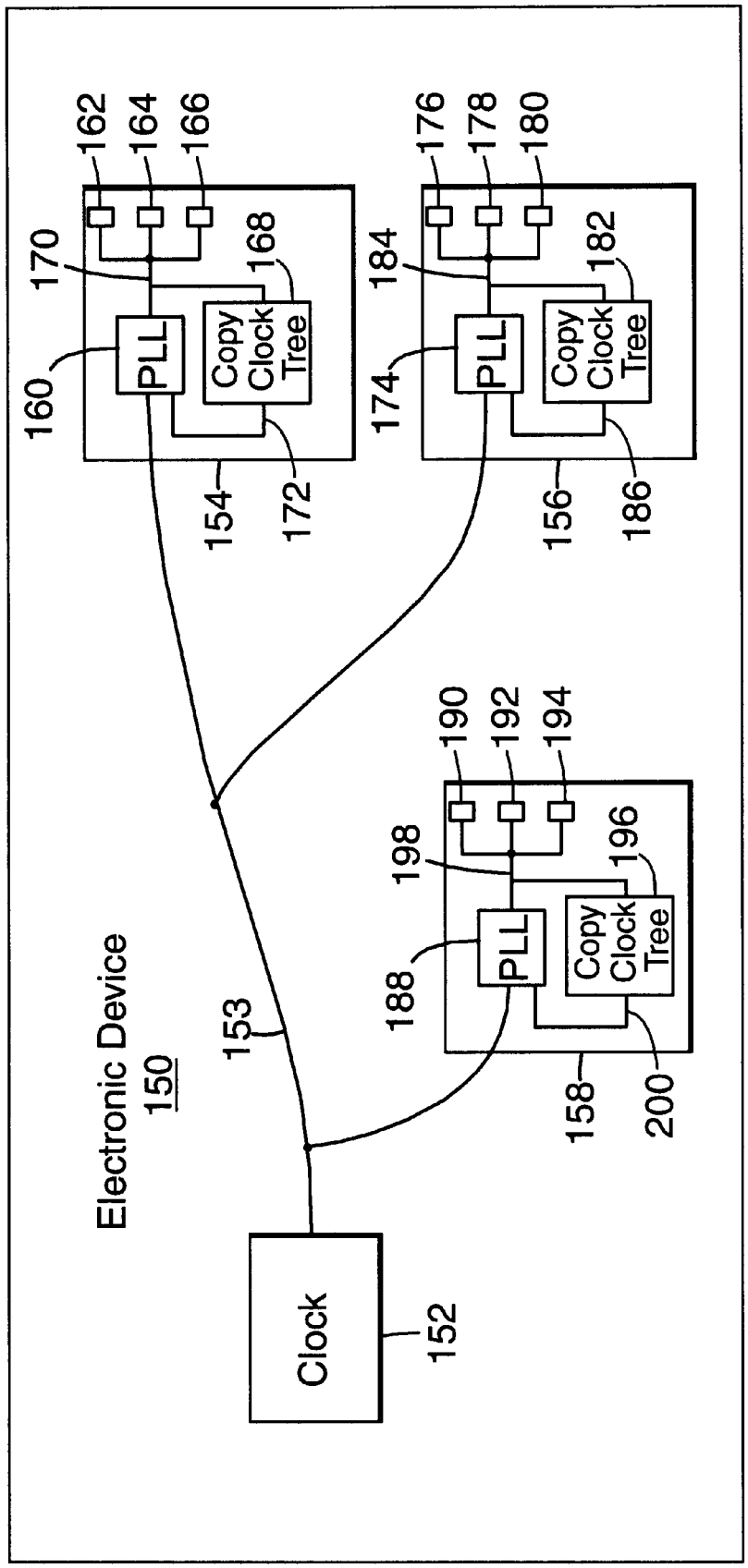
FIG. 2 is a block diagram illustrating a second embodiment of a prior art clocking scheme of an electronic device.

FIG. 2 is a block diagram of electronic device 150 illustrating a second prior art clocking scheme. Electronic device 150 includes clock 152, clock signal 153, and integrated circuits 154, 156, and 158. Integrated circuit 154 includes phase locked loop 160, electronic components 162, 164, and 166, copy clock tree 168, real clock signal 170, and copy clock signal 172. Integrated circuit 156 includes phase locked loop 174, electronic components 176, 178, and 180, copy clock tree 182, real clock signal 184, and copy clock signal 186. Integrated circuit 158 includes phase locked loop 188, electronic components 190, 192, 194, copy clock tree 196, real clock signal 198, and copy clock signal 200.

Electronic device 150 operates as follows. Clock signal 153 is provided from clock 152 to phase locked loops 160, 174, and 188 of integrated circuits 154, 156, and 158. Real clock signals 170, 184, and 198 are then propagated out of phase locked loops 160, 174, and 188 and branched off to electronic components 162, 164, 166, 176, 178, 180, 190, 192, and 194. Real clock signals 170, 184, and 198 are also sent out of phase locked loops 160, 174, and 188 to copy clock trees 168, 182, and 196. Copy clocks trees 168, 182, and 196 generate a copy or "dummy" clock, which attempts to mimic real clock signals 170, 184, and 198. Copy clock trees 168, 182, and 196 provide copy clock signals 172, 186, and 200 to an input of phase locked loops 160, 174, and 188, respectively.

The halting of the clock to test integrated circuit 154, 156, and 158 does not affect the phase locked loop feedback path of phase locked loops 160, 174, and 188 since the clock is halted at a point after copy clock trees 168, 182, and 196 are branched off. Thus, the associated feedback paths are not generated from a feedback point on real clock signals 170, 184, and 198, but rather include copy clock signals 172, 186, and 200, respectively.

During test mode, electronic device 150 will properly operate in that data may be scanned in to various electronic components, the clock can be stepped, and data can be scanned out of the electronic components, as discussed with reference to FIG. 1. However, the clocking scheme shown in FIG. 2 has a critical disadvantage in that the "copy" of real clock signals 170, 184, and 198 generated within copy clock trees 168, 182, and 196 are difficult to match and track real clock signals 170, 184, and 198 in latency over process and operating conditions. This matching requirement is critical where the feedback loop is to precisely control the clock time placement within a specific integrated circuit, compensating for the process and operating variations of the integrated circuit clock tree latency. To the degree that this mismatch and mis-track is inaccurate, there is a direct increase in the clock skew between integrated circuits within a system. This clock slew is a significant penalty to incur a normal, non-test mode when the sole purpose of copy clocks 168, 182, and 196 and copy clock signals 172, 186, and 200 is to maintain lock during test procedures, which comprise a minimal amount of time of the overall operation of electronic device 150.

Figure 3:
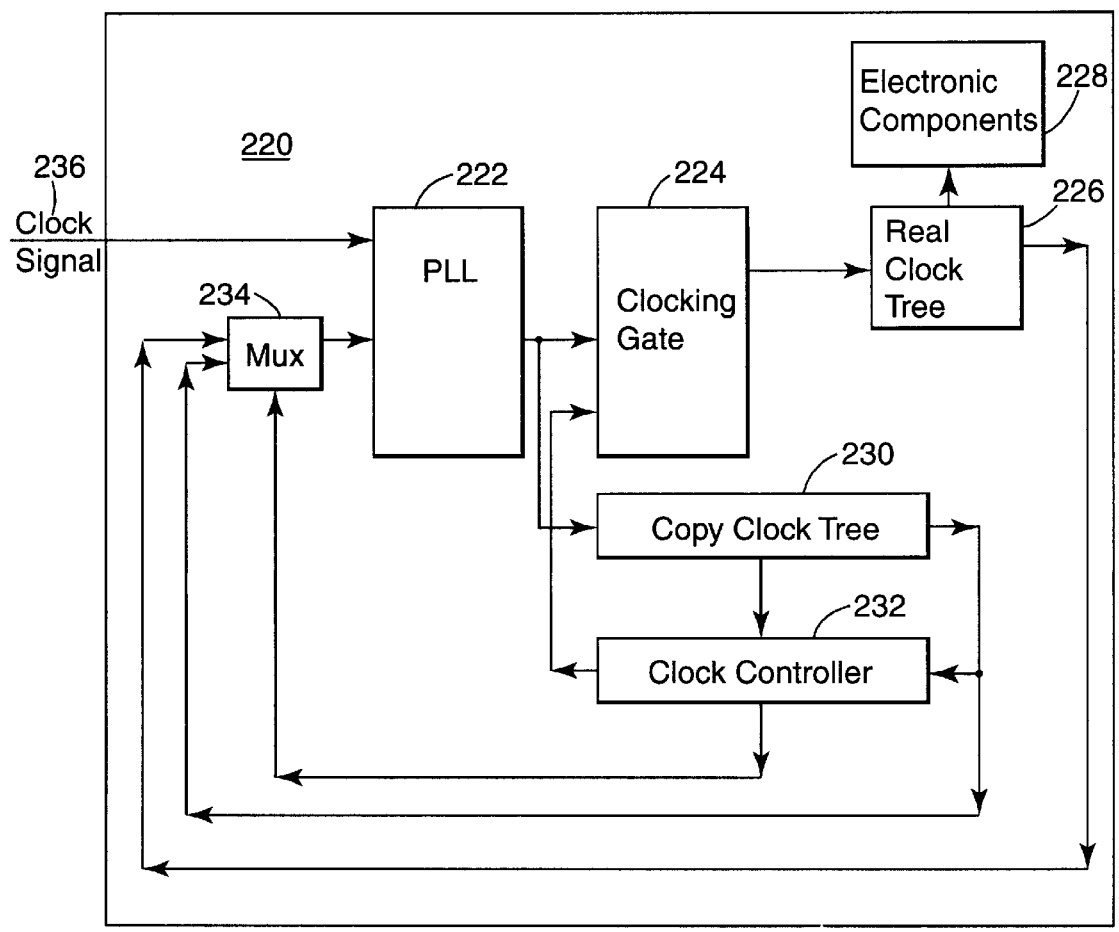
FIG. 3 is a block diagram illustrating the clocking scheme of a particular integrated circuit in accordance with the present invention.

FIG. 3 is a block diagram of integrated circuit 220 illustrating the clocking sequence in accordance with the present invention. Integrated circuit 220 includes phase locked loop 222, clocking gate 224, real clock tree 226, electronic components 228, copy clock tree 230, clock controller 232, and multiplexor 234. While FIG. 3 illustrates a single integrated circuit, this is done for illustrative purposes only. It is understood that any number of integrated circuits can be connected to clock signal 236, which is generated from a clock not shown in FIG. 3. In addition, it is understood that electronic components 228 may include any number of segregated electronic components capable of providing various functions as necessary.

The clocking scheme of integrated circuit 220 differs from the clocking scheme of the integrated circuits shown in FIGS. 1 and 2 in that the clocking scheme shown in FIG. 3 includes two separate, parallel running phase locked loop feedback paths. One feedback path from phase locked loop 222 includes clocking gate 224, real clock tree 226, and multiplexor 234. The second feedback path from phase locked loop 222 includes copy clock tree 230 and multiplexor 234.

Integrated circuit 220 operates as follows. Phase locked loop 222 receives clock signal 236 at an input of phase locked loop 222. Clock signal 236 is propagated from a clock, such as clocks 102 and 152 shown in FIGS. 1 and 2, respectively. The output of phase locked loop 222 is provided to clocking gate 224 and copy clock tree 230. During a normal operation, clocking gate 224 permits clock signal 236 to pass through clocking gate 224, which is forwarded to numerous electronic components 228 via real clock tree 226. During a test mode, clocking gate 224 is disabled, thereby preventing the propagation of clock signal 236 into real clock tree 226. Real clock tree 226 represents the various paths which clock signal 236 propagates down in order to drive electronic components 228. Clock signal 236 also propagates out of real clock tree 226 and is provided at the input of multiplexor 234.

Phase locked loop 222 also provides clock signal 236 to copy clock tree 230. Copy clock tree 230 is a generated copy of real clock tree 226 as previously discussed. Copy clock tree 230 provides a copy clock signal to an input of multiplexor 234. Copy clock tree also provides multiple clock signals to clock controller 232 including a normal copy clock signal and one or more early tap signals representing various senses of earliness of the copy clock tree.

Clock controller 232 controls whether the feedback path including real clock tree 226 and a real clock signal or the feedback path including copy clock tree 230 and a copy clock signal is provided as a feedback input signal to phase locked loop 222. Clock controller 232 provides an enable/disable signal to clocking gate such that clocking gate 224 either is either enabled and allows the clock signal 236 to pass through clocking gate 224 to real clock tree 226 or is disabled and halts clock signal 236. In addition, clock controller 232 provides a select input signal to multiplexor 234. Clock controller 232 selects which feedback path provides a feedback input to phase locked loop 222. In normal operation mode, clock controller 232 enables clocking gate 224 such that clock signal 236 is provided to real clock tree 226. A real clock signal from real clock tree 226 is then provided to electronic components 228. Also during a normal operation mode, clock controller 232 provides a signal to multiplexor 234 such that the output of multiplexor 234 is provided from real clock tree 226. Thus, a feedback input to phase locked loop 222 includes a feedback path including a real clock signal. Therefore, under normal operation mode, the skew of integrated circuit 220 is minimized since the phase locked loop feedback signal is generated from a real clock signal.

While in normal operation mode, the phase locked loop feedback path including copy clock tree 230 continues to cycle; however, the signal is never propagated to the feedback input of phase locked loop 222 since multiplexor 234 is constantly selecting a feedback path including real clock tree 226 as the phase locked loop feedback input.

When integrated circuit 220 switches operation from a normal operation mode to a test mode, two specific changes occur. First, clock controller 232 provides a signal to clocking gate 224 such that clocking gate is disabled. With clocking gate 224 disabled, signal clock 236 is halted within clocking gate 224 and does not propagate to real clock tree 226 or electronic components 228. Second, clock controller 232 provides a signal to multiplexor 234 such that the signal from copy clock tree 230 is provided as an input to a feedback input of phase locked loop 222. These two changes, the halting of clock signal 236 within clocking gate 224 and the switching of the phase locked loop feedback path from a path including a real clock signal to a path including a copy signal, occur within the same clock cycle. Thus, phase locked loop 222 maintains lock during the switching from the normal operation mode the test mode.

Under test mode, integrated circuit 220 is tested to ensure proper operation and interconnection. Known data is scanned into electronic components 228 through known means not shown in FIG. 3 for clarity purposes. Real clock tree 226 is then restarted, i.e., forced into electronic components 228, such that it provides one or more clock cycles to electronic components 228. In one preferred embodiment, real clock tree 226 provides only one or two clock cycles. In another preferred embodiment, up to 500 clock cycles are necessary. The data within electronic components 228 is scanned out of electronic components 228 between cycles and analyzed. This stop and scan process can be repeated as necessary until all tests are complete. The scanned out data is compared to expected data. If scanned data corresponds to desired data, it is confirmed that integrated circuit 220 is properly operating. The phase locked loop feedback path including copy clock tree 230 maintains the lock of phase locked loop 222 during test mode.

The present invention, as shown and described with reference to FIG. 3, provides for a minimal clock skew by incorporating a feedback path originating from real clock tree 226 under normal operation mode. In addition, the design shown in FIG. 3 maintains lock of phase locked loop 222 during a test mode by incorporating a feedback path including a copy clock signal.

Figure 4:
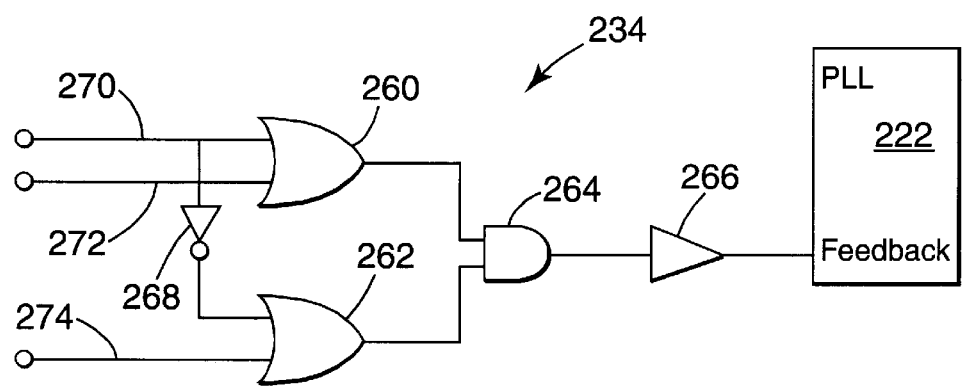
FIG. 4 is a circuit diagram illustrating a multiplexor in accordance with the present invention.

FIG. 4 is a circuit diagram illustrating multiplexor 234 in accordance with the present invention. Multiplexor 234 includes OR gates 260 and 262, AND gate 264, buffer 266, and inverter 268. Signal 270 comes from clock controller 232, is provided to OR gate 260, while an inverted signal corresponding to signal 270 is provided to OR gate 262. Real clock signal 272, which corresponds to a clock signal from real clock tree 226 of FIG. 3, is provided to OR gate 260. Copy clock signal 274, which corresponds to clock signal from copy clock tree 230 of FIG. 3, is provided to OR gate 262. With the configuration of OR gates 260 and 262 and inverter 268, the outputs of OR gates 260 and 262 will always be opposite each other. Thus, the output of AND gate 264 corresponds to either real clock signal 272 or copy clock signal 274. The chosen signal is propagated through buffer 266 and is provided as a phase locked loop feedback path input as previously described.

Figure 5:
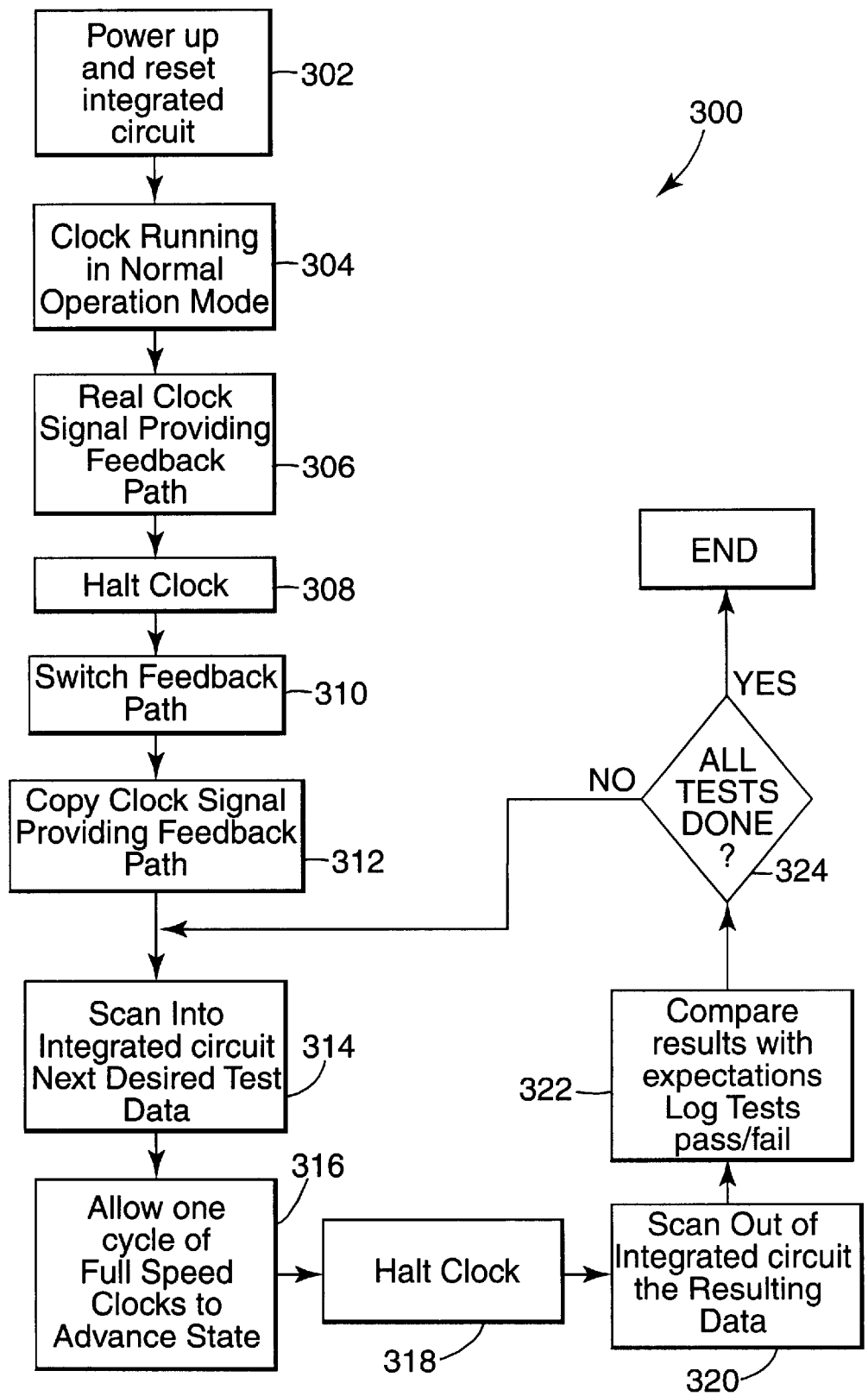
FIG. 5 is a flow chart illustrating a method of testing an integrated circuit in accordance with the present invention.

FIG. 5 is a flow chart illustrating a method of testing an integrated circuit in accordance with the present invention. Method 300 begins by powering up and resetting an integrated circuit such that it is capable of performing its intended function, as shown at step 302. At step 304, the system clock is running in normal operation mode. At step 306, a real clock signal is providing a feedback point for a feedback path of the phase locked loop of the integrated circuit. At step 308, the clock signal provided to the electronic components of the integrated circuit is halted. Simultaneously with the halting of the clock signal to the electronic component, the feedback path of the phase locked loop is switched such that the feedback point comes from a copy clock signal, rather than the real clock signal, as shown at steps 310 and 312. Thus, lock of the feedback path is maintained during the switching from the normal operation mode to the test mode.

At step 314, known data, or test data, is scanned into the electronic components of the integrated circuit by known means. At step 316, the clock is driven for one full cycle into the electronic components at full speed to advance the state of the electronic components. At step 318, the clock is again halted. The resulting data within the electronic components of the integrated circuit are scanned out of the electronic components, as shown at step 320. At step 322, the test results are analyzed. More specifically, the scanned out test data is compared to expected results. The scanned out test data is logged, and it is determined whether the integrated circuit passed or failed the particular test. At decision step 324, it is determined whether all tests have been completed. If all tests are completed, the system may be reset or switched back to the normal operation mode. However, if all tests are not completed, a new set of known data is scanned into the integrated circuit, as shown at step 314 and the process is repeated.

The present invention provides a system and method for maintaining lock of a phase locked loop within an integrated circuit during both a normal operation mode and a test mode, and during the switching from the normal operation mode to the test mode. The present invention minimizes a skew associated with a clock signal within an integrated circuit. Two separate parallel phase locked loop feedback paths are included in the present invention such that a first feedback a feedback point chosen from a real clock tree which is provided to a phase locked loop during a normal operation mode of the integrated circuit. A second phase locked loop feedback path includes a feedback point chosen from a copy clock signal which is provided to the phase locked loop during a test mode of the integrated circuit. The feedback path provided at an input to the phase locked loop is switched from the real clock signal feedback path to the copy clock signal feedback path in the same clock cycle that the real clock tree is halted to initial test procedures. The lock is maintained during lock at all times, including during the switching from the normal operation mode to the test mode. Thus, the present invention provides a phase locked loop feedback path which minimizes the skew of the system, regardless of the mode of the system.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiments shown and described without departing from the scope of the present invention. Those with skill in the chemical, mechanical, electromechanical, electrical, and computer arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. A method of maintaining lock of a phase locked loop within an integrated circuit during a normal operation mode and a test mode, and during switching from the normal operation mode to the test mode, the method comprising:

closing a phase locked loop feedback path of the phase locked loop with a real clock signal from a real clock tree during the normal operation mode;

halting the real clock tree, thereby transitioning from the normal operation mode to the test mode; and closing the phase locked loop feedback path of the phase locked loop with a copy clock signal from a copy clock tree during the test mode, wherein the copy clock signal attempts to mimic the real clock signal, such that the phase locked loop maintains lock during both the normal operation mode and the test mode, and during the switch from the normal operation mode to the test mode.

2. The method of claim 1, and further comprising:

providing an output signal of the phase locked loop to the real clock tree and to the copy clock tree during normal operation mode.

3. The method of claim 1, wherein the step of halting the real clock tree further comprises:

disabling a clocking gate located in the real clock tree such that an output signal of the phase locked loop does not pass through the gate.

4. The method of claim 1, and further comprising:

selectively controlling a phase locked loop feedback input signal based upon a mode of the integrated circuit.

5. The method of claim 1, and further comprising:

providing a clock signal to the real clock tree and the copy clock tree.

6. The method of claim 5, wherein the step of halting the real clock tree further comprises:

halting the clock signal provided to the real clock tree, while continuing to provide the clock signal to the copy clock tree.

7. The method of claim 5, wherein the steps of halting the real clock tree and closing the phase locked loop feedback path with the copy clock signal further comprise:

halting the clock signal provided to the real clock tree, thereby transitioning from the normal operation mode to the test mode, and switching the phase locked loop feedback path from including the real clock signal to including the copy clock signal within a single clock cycle.

8. The method of claim 1, and further comprising:

testing the integrated circuit during the test mode.

9. The method of claim 8, wherein the step of testing the integrated circuit further comprises:

scanning known data into electronic components of the integrated circuit;

providing a full speed clock to the electronic components of the integrated circuit for at least one clock cycle; and scanning data out of the electronic components of the integrated circuit.

10. The method of claim 9, and further comprising:

comparing the scanned data to expected data.

11. The method of claim 10, and further comprising:

resetting the integrated circuit after the step of comparing the scanned data to expected data.

12. The method of claim 10, and further comprising:

repeating any incomplete parts of the testing, including repeating the scanning known data in, providing the full speed clock, scanning data out, and comparing the scanned data steps until the testing is complete.

13. The method of claim 1, further comprising:

switching from the test mode to the normal operation mode, wherein the phase locked loop maintains lock during and after the switching, wherein the switching includes:

starting the real clock tree; and closing the phase locked loop feedback path of the phase locked loop with the real clock signal from the real clock tree.

14. A method of maintaining lock of a phased locked loop within an integrated circuit to facilitate testing the integrated circuit, the method comprising:

closing a phase locked loop feedback path of a phase locked loop with a real clock signal from a real clock tree during a normal operation mode;

halting the real clock tree, thereby transitioning from the normal operation mode to a test mode;

closing the phase locked loop feedback path of the phase locked loop with a copy clock signal from a copy clock tree during the test mode, wherein the copy clock signal attempts to mimic the real clock signal, such that the phase locked loop maintains lock;

scanning known data into electronic components of the integrated circuit;

providing a full speed clock to the electronic components of the integrated circuit for at least one clock interval, wherein the phase angle of the full speed clock during the at least one clock interval is substantially equal to the phase angle of the real clock tree as the phase angle existed prior to the halting of the real clock tree; and scanning data out of the electronic components of the integrated circuit.

15. The method of claim 14, and further comprising:

providing an output signal of the phase locked loop to the real clock tree and to the copy clock tree during normal operation mode.

16. The method of claim 14, wherein the step of halting the real clock tree further comprises:

disabling a clocking gate located in the real clock tree such that an output signal of the phase locked loop does not pass through the gate.

17. The method of claim 14, and further comprising:

selectively controlling a phase locked loop feedback input signal based upon a mode of the integrated circuit.

18. The method of claim 14, and further comprising:

providing a clock signal to the real clock tree and the copy clock tree.

19. The method of claim 18, wherein the step of halting the real clock tree further comprises:

halting the clock signal provided to the real clock tree, while continuing to provide the clock signal to the copy clock tree.

20. The method of claim 18, wherein the steps of halting the real clock tree and closing the phase locked loop feedback path with the copy clock signal further comprise:

halting the clock signal provided to the real clock tree, thereby transitioning from the normal operation mode to the test mode, and switching the phase locked loop feedback path from including the real clock signal to including the copy clock signal within a single clock cycle.

21. The method of claim 14, and further comprising:

comparing the scanned data to expected data.

22. The method of claim 21, and further comprising:

resetting the integrated circuit after the step of comparing the scanned data to expected data.

23. The method of claim 21, and further comprising:

repeating any incomplete parts of testing the integrated circuit, including repeating the scanning known data in, providing the full speed clock, scanning data out, and comparing the scanned data steps until the testing is complete.

24. The method of claim 14, wherein the phase locked loop remains locked during switching from the normal operation mode to the test mode.

25. The method of claim 14, wherein the providing of the full speed clock is accomplished by switching from the test mode to the normal operation mode, wherein the phase locked loop maintains lock during and after the switching, wherein the switching includes:

starting the real clock tree; and closing the phase locked loop feedback path of the phase locked loop with the real clock signal from the real clock tree.

26. A system for maintaining lock of a phase locked loop within an integrated circuit during a normal operation mode and a test mode, and during switching between the normal operation mode and the test mode, the system comprising:

a phase locked loop having a clock input, a feedback input, and an output, the clock input of the phase locked loop capable of receiving a clock signal;

a clocking gate having an input electrically coupled to the output of the phase locked loop;

a real clock tree electrically coupled to an output of the clocking gate, the real clock tree providing the clock signal to electrical components of the integrated circuit;

a copy clock tree electrically coupled to the output of the phase locked loop;

a multiplexor having a first input electrically coupled to the real clock tree and a second input electrically coupled to the copy clock tree, the multiplexor having an output electrically coupled to the feedback input of the phase locked loop; and a controller electrically coupled to the clocking gate for selectively controlling the output of the clocking gate, and electrically coupled to the multiplexor for selectively controlling the output of the multiplexor.

27. The system of claim 26, wherein the controller halts the real clock tree at the clocking gate and switches the output of the multiplexor from the real clock tree to the copy clock tree within a single clock cycle.

28. The system of claim 26, wherein the multiplexor further comprises:

a first OR gate having a first input electrically coupled to the real clock tree and a second input electrically coupled to a controller signal from the controller;

an inverter electrically coupled to the controller signal;

a second OR gate having a first input electrically coupled to the copy clock tree and a second input coupled to an output of the inverter; and an AND gate having a first input electrically coupled to an output of the first OR gate and a second input electrically coupled to an output of the second OR gate, the AND gate having an output corresponding to the output of the multiplexor.

* * * * *